United States Patent [19]

Hisamune

[11] Patent Number: 6,040,234
[45] Date of Patent: Mar. 21, 2000

[54] METHOD OF MANUFACTURING SEMICONDUCTOR DEVICE WITHOUT BIRD BEAK EFFECT

[75] Inventor: Yosiaki Hisamune, Tokyo, Japan

[73] Assignee: NEC Corporation, Japan

[21] Appl. No.: 08/881,024

[22] Filed: Jun. 23, 1997

[30] Foreign Application Priority Data

Jul. 30, 1996 [JP] Japan .................................. 8-200708

[51] Int. Cl.⁷ .......................... H01L 21/225; H01L 21/76
[52] U.S. Cl. ........................... 438/439; 438/218; 438/262
[58] Field of Search .................................. 438/218, 262, 438/439, 297

[56] References Cited

U.S. PATENT DOCUMENTS

| 4,373,248 | 2/1983 | McElroy | 438/262 |
| 5,256,593 | 10/1993 | Iwai | 438/218 |

FOREIGN PATENT DOCUMENTS

| 1137673 | 5/1989 | Japan | H01L 29/78 |
| 6283721 | 10/1994 | Japan | H01L 29/788 |
| 6291329 | 10/1994 | Japan | H01L 29/788 |

OTHER PUBLICATIONS

"High Density Contactless Self Aligned Eprom Cell Array Technology" Esquivel et al.
Technical Digest of International Electron Devices Meeting, 1986; pp. 592–595.

"A New Process for Silica Coating" Nagayama et al.
Journal of Electrochemical Society, vol. 135,. No. 8, 1988; pp. 2013–2016.

"A New Interlayer FormatioN Technology for Completely Planarized Multilevel Interconnection by using LPD" Homma et al.
1990 Symposium on VLSI Technology, pp. 3–4.

*Primary Examiner*—Charles Bowers
*Assistant Examiner*—David S Blum
*Attorney, Agent, or Firm*—Hayes, Soloway, Hennessey, Grossman & Hage, P.C.

[57] ABSTRACT

In a method of manufacturing a semiconductor device, diffusion layers are formed on a semiconductor substrate using a mask. The diffusion layers has a conductive type different from that of the semiconductor substrate. Then, insulating films are formed on the diffusion layers using the mask and the mask is removed. Subsequently, a floating gate is formed between the insulating films on the semiconductor substrate via a first gate insulating film. Next, a second gate insulating film is formed on the floating gate and the insulating films, and a word line is formed to cover the floating gate via the second gate insulating film.

15 Claims, 9 Drawing Sheets

METHOD OF MANUFACTURING SEMICONDUCTOR DEVICE WITHOUT BIRD BEAK EFFECT

BACKGROUND OF THE INVENTION

1. Field of the Invention

The present invention is relates to a method of manufacturing a semiconductor device, and more particularly to a method of manufacturing a non-volatile semiconductor memory device.

2. Description of the Related Art

In a non-volatile semiconductor memory device like flash EEPROM and EPROM, high integration is very important. For this reason, various methods for the high integration of memory cells are studied.

Recently, as a memory cell of a small occupation area, a contactless memory cell is proposed in which a buried diffusion layer is used as a bit line, and a memory cell does not have a contact with the bit line. The contactless memory cell is described in, for example, a paper entitled "HIGH DENSITY CONTACTLESS, SELF ALIGNED EPROM CELL ARRAY TECHNOLOGY", (TECHNICAL DIGEST OF INTERNATIONAL ELECTRON DEVICES MEETING, 1986, pp. 592–595: conventional example 1), and Japanese Laid Open Patent Disclosure (JP-A-Heisei 6-283721: conventional example 2). In these conventional examples, it is disclosed that a bit line is composed of a diffusion layer and the surface of this diffusion layer is subjected to thermal oxidization. Here, the conventional example 1 is concerned with the contactless memory cell of a virtual ground array (VGA) structure and the conventional example 2 is concerned with the contactless cell of a NOR circuit structure.

The technique described in the conventional example 2 will be described below with reference to FIGS. 1A to 1G and FIG. 2. FIGS. 1A to 1G are cross sectional views of the manufacturing process of a memory cell section in order. These views are the cross sectional views of the memory cell section cut along a word line 116 which is shown in FIG. 2. FIG. 2 is an equivalent circuit diagram of an array structure of such memory cells.

As shown in FIG. 1A, field oxide films 102 are selectively formed on the surface of a P-type silicon substrate 101. Then, a protection insulating film 103 is formed on the silicon substrate in the area where the field oxide films 102 are not formed.

Next, as shown in FIG. 1B, a photo-resist mask 104 is formed in predetermined areas on the protection insulating film 103. Using the photo-resist mask 104 as an ion implantation mask, an N-type impurity such as arsenic ions is introduced by use of ion implantation. In this method, impurity introduction layers 105 are formed. Then, heat treatment is performed to activate the introduced impurity ions.

Next, as shown in FIG. 1C, the surface of the substrate is thermally oxidized so as to form buried diffusion layers 106. At this time, diffusion layer thermal oxidation films 107 are formed on the buried diffusion layers 106. This is because the N-type impurity introduction layers 105 are oxidized fast through the above thermal oxidation. As a result, the film thickness of the diffusion layer thermal oxidation films 107 becomes thicker than that of the other area. In this case, the diffusion layer thermal oxidation films 107 are formed to have the film thickness of about 100 nm.

Next, as shown in FIG. 1D, the protection insulating film 103 is removed and a first gate insulating film 108 is formed to function as a tunnel insulating film. The film thickness of this first gate insulating film 108 is about 10 nm. Then, a first polysilicon film 109 is formed to cover the first gate insulating film 108. Phosphorus impurity ions are doped in the first polysilicon film 109. Next, a second gate insulating film 110 is formed on the surface of the first polysilicon film 109. This second gate insulating film 110 is composed of a silicon oxide film, a silicon nitride film and a silicon oxide film (ONO). The film thickness of the second gate insulating film 110 is set to be in a range of 10 to 30 nm when it is converted to the film thickness of a silicon oxide film.

Next, as shown in FIG. 1E, photo-resist masks 111 are formed. Using the photo-resist masks 111 as etching masks, the first polysilicon film 109 is etched by use of a dry etching method to form first polysilicon films 109a in a strip manner.

Further, the N-type impurity such as arsenic ions is implanted by use of ion implantation to form an impurity introduction layer 112.

Next, the photo-resist masks 111 are removed. Then, heat treatment is performed, and then thermal oxidation is performed to form a buried diffusion layer 113. A diffusion layer thermal oxidation film 114 is formed on the buried diffusion layer 113 through this thermal oxidation. Also, a thick thermal oxidation film is formed on the sidewalls of the strip-shaped first polysilicon films 109a. These thermal oxidation films have the film thickness of about 100 nm.

Next, as shown in FIG. 1G, a second polysilicon film 115 is formed. Then, word lines are formed by use of a photolithography process and a dry etching process in subsequent steps. In the dry etching to pattern this word line, the dry etching is performed to the strip-shaped first polysilicon films 109a after the etching of the second polysilicon film 115. Thus, a floating gate electrode is formed.

In this method, using the buried diffusion layer 106 as a sub-bit line and the buried diffusion layer 113 as a sub-source line, a memory cell is formed to have a floating gate electrode which is formed between the sub-bit line and the sub-source line. In this case, the floating gate electrode extends to cross the buried diffusion layer 113 as the sub-source line and the buried diffusion film 106 as the sub-bit line and to cover the field oxide film 102. Therefore, the thick silicon oxide films which are formed on the buried diffusion layers 106 and 113 through the thermal oxidation, i.e., the diffusion layer thermal oxidation films 107 and 114 are important on the manufacturing process.

In the patterning of the floating gate electrode, the first polysilicon film 109 is patterned in the direction of the column direction, i.e., in parallel to the bit line to form the first polysilicon films 109a in a stripe manner. Then, the first polysilicon film 109 is patterned in the row direction, i.e., in parallel to the word line. Thus, the floating gate electrode is formed. This patterning in the row direction parallel to the word line is performed in a self-alignment manner with the word line as a control gate electrode by use of the etching. In this case, the diffusion layer thermal oxidation films 107 and 114 function as an etching stopper for the silicon substrate not to be etched, in the area where the polysilicon film is already removed by the patterning in the column direction. For this reason, the diffusion layer thermal oxidation films 107 and 114 are important on the manufacturing process.

Next, the array structure of such memory cells will be simply described.

As shown in FIG. 2, word lines 116 are connected to the control gate electrode of the floating gate-type transistor. Also, a main bit line 117 is arranged and a sub-bit line 118 is connected to this main bit line 117 via a MOS transistor. This sub-bit line 118 is composed of the above-mentioned buried diffusion film 106.

In the same method, a main source line 119 is provided and a sub-source line 120 is connected to this main source line 119 through a MOS transistor. This sub-source line 120 is composed of the above-mentioned buried diffusion layer 113.

However, in the method of manufacturing a contactless memory cell in such conventional technique, there is a limit in the forming of the memory cell by use of fine patterns so that the high integration of the non-volatile semiconductor memory device is difficult. The reason is that in the conventional technique, a silicon oxide film is formed on the buried diffusion layer through the thermal oxidation. For this reason, bird's beak, i.e., the extension of the silicon oxide film in channel direction of the floating gate-type transistor which is generated by this thermal oxidation constitutes a large bar of the fine processing.

Also, in such conventional technique, the estimation on the electric characteristic of the buried diffusion layer is difficult so that the circuit design is difficult. This is because the impurity ions in the buried diffusion layer are re-distributed through the thermal oxidation of the buried diffusion layer. That is, the diffusion layer containing impurity ions with a high concentration is oxidized fast and, at the same time, the impurity ions are piled up on the diffusion layer surface. For this reason, the electric resistance of the buried diffusion layer and the junction breakdown voltage between the buried diffusion layer and the silicon substrate can not be estimated.

SUMMARY OF THE INVENTION

An object of the present invention is to provide a method of manufacturing a semiconductor device in which a silicon oxide film can be formed on a diffusion layer in self-alignment manner without thermal oxidation.

Another object of the present invention is to provide a method of manufacturing a semiconductor device in which a contactless memory cell can be finely formed.

In order to achieve an aspect of the present invention, a method of manufacturing a semiconductor device, includes the steps of:

forming diffusion layers on a semiconductor substrate using a mask, the diffusion layers having a conductive type different from that of the semiconductor substrate;

forming insulating films on the diffusion layers using the mask;

removing the mask;

forming a floating gate between the insulating films on the semiconductor substrate via a first gate insulating film;

forming a second gate insulating film on the floating gate and the insulating films; and forming a word line to cover the floating gate via the second gate insulating film.

When the mask is a resist mask, the insulating films is formed by a selective liquid phase growth method. In this case, a surface of the mask is made hydrophobic prior to the selective liquid phase growth method. That is, the diffusion layers are formed by performing ion implantation, and the surface of the mask is made hydrophobic through ion implantation.

When the mask is an insulating film mask, more specifically, is formed of silicon nitride, the insulating films are formed of silicon oxide. In this case, an insulating layer is deposited, and a chemical mechanical polishing method is performed to the insulating layer using the mask as a stopper to form the insulating films.

The method may further include the step of forming a field oxide film on the semiconductor substrate before the step of forming diffusion layers. In this case, in the manufacturing method, the field oxide film is formed on the semiconductor substrate in a stripe manner in a first direction, the diffusion layers are formed on the semiconductor substrate using the mask along the field oxide film in a stripe manner in the first direction. Also, the floating gates are formed in an island manner to cover a channel region between the diffusion layers via the first gate insulating film. Further, the word line is formed in a stripe manner in a second direction orthogonal to the first direction.

In order to achieve another aspect of the present invention, a method of manufacturing a semiconductor device, includes the steps of:

forming and patterning a first insulating film having stripe-shaped opening portions in a first direction on a semiconductor substrate;

forming diffusion layers as sources or drains on the semiconductor substrate in a stripe manner using the stripe-shaped opening portions of the first insulating film, the diffusion layers having a conductive type different from that of the semiconductor substrate;

forming second insulating films on the diffusion layers in a stripe manner using the stripe-shaped opening portions of the first insulating film;

removing the first insulating film;

forming a first gate insulating film after the removal of the first insulating film;

depositing and patterning a polysilicon film to form floating gates respectively covering channel regions between the source and drain;

forming a second gate insulating film after the floating gates are formed; and forming a word line as a control gate in a stripe manner in a second direction orthogonal to the first direction to cover the floating gate via the second gate insulating film.

DESCRIPTION OF THE PREFERRED EMBODIMENTS

A manufacturing method of a semiconductor device of the present invention will be described below in detail with reference to the attached drawings.

First, a manufacturing method of a semiconductor device according to the first embodiment of the present invention will be described with reference to FIGS. 3, 4 and 5A to 5G.

Figure 1A:
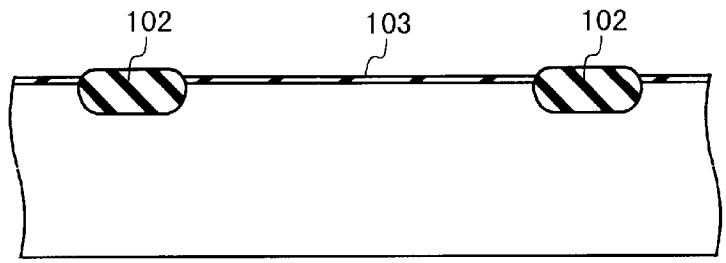
FIGS. 1A to 1G are cross sectional views illustrating a manufacturing process of a memory cell in order in a conventional technique.
Figure 1B:
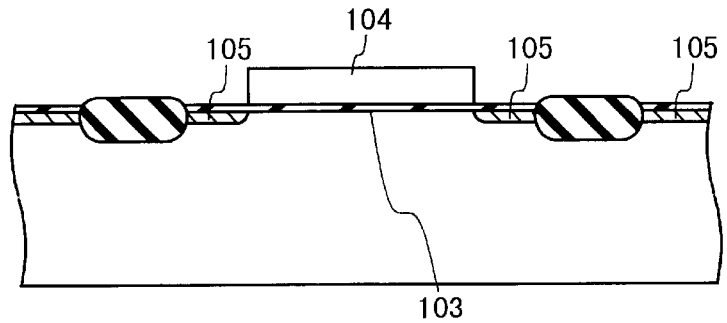
Figure 1C:
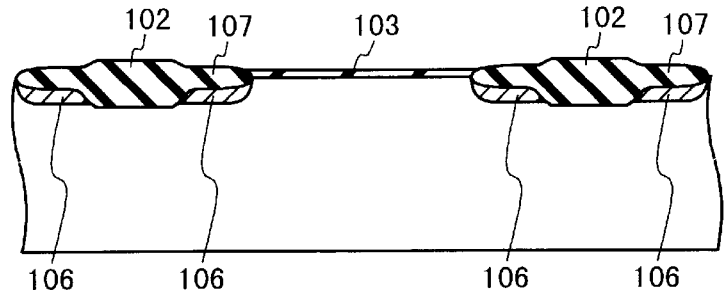
Figure 1D:
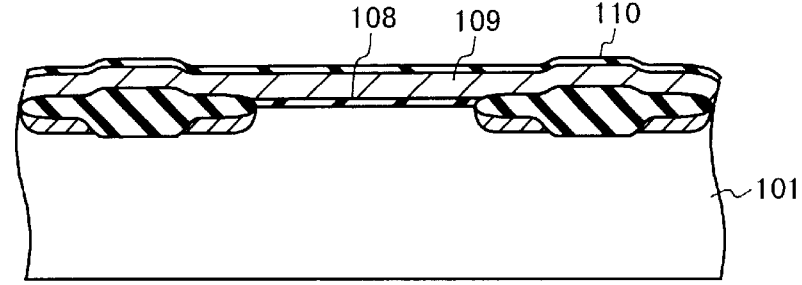
Figure 1E:
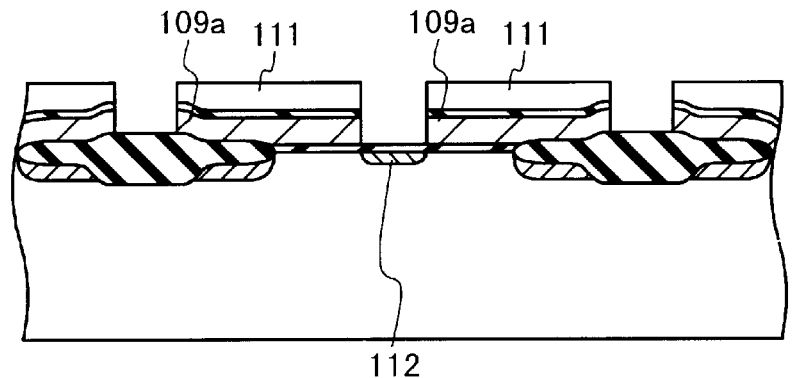
Figure 1F:
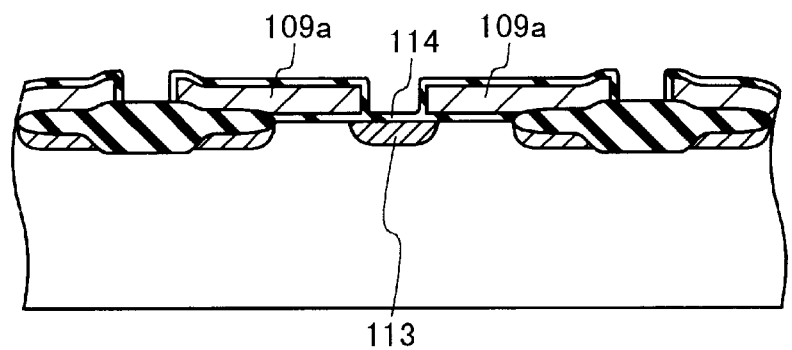
Figure 1G:
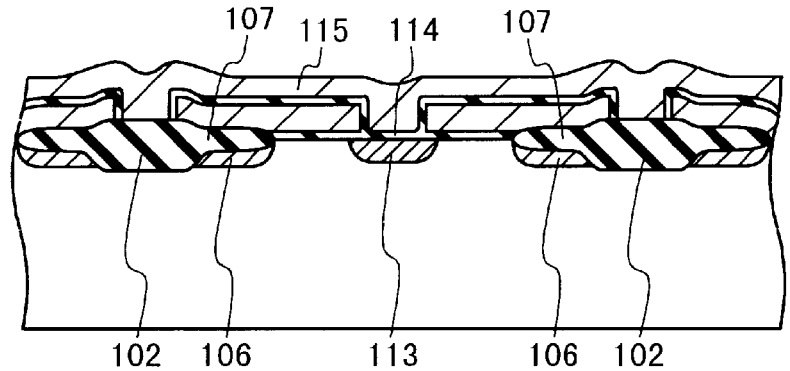
Figure 2:
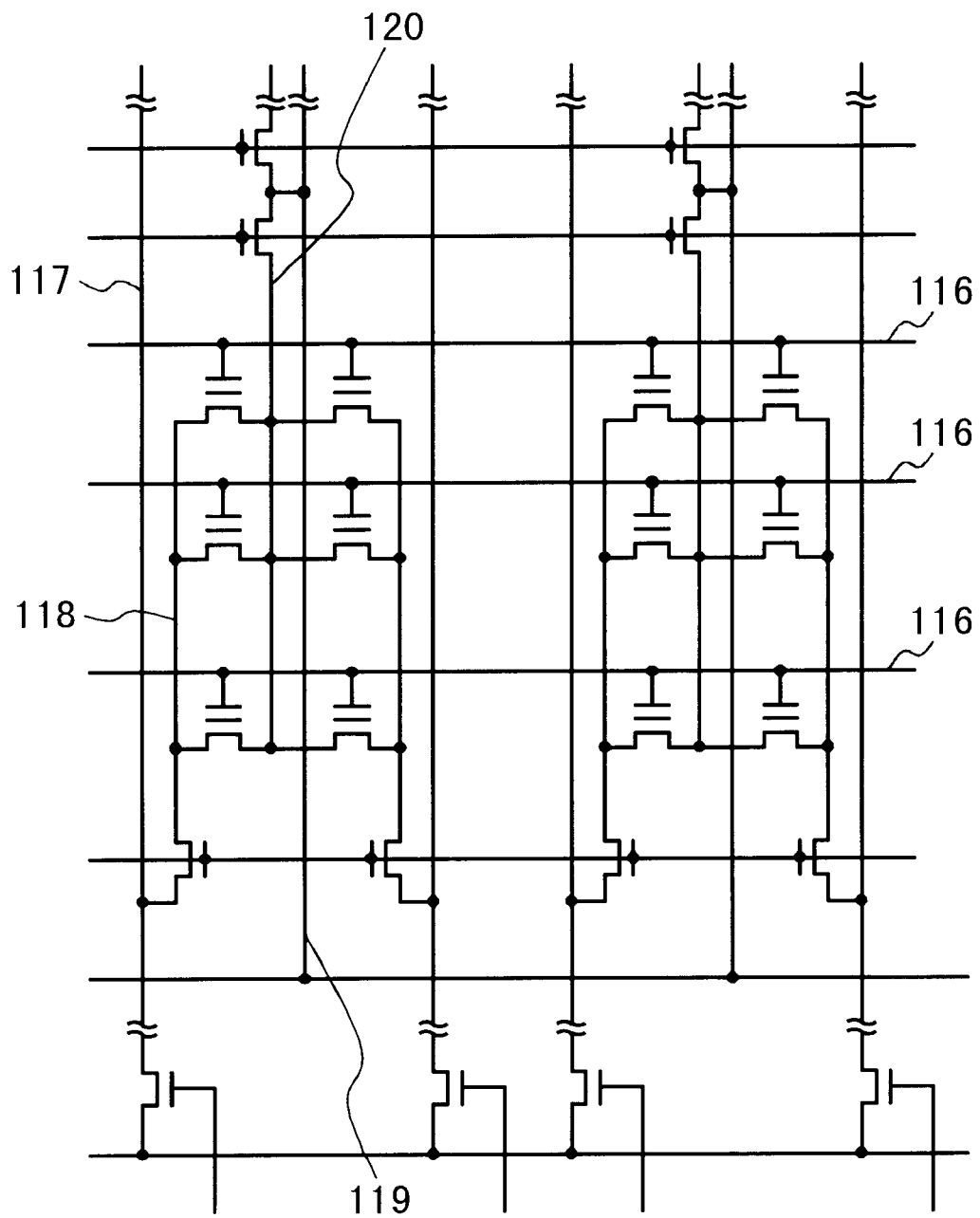
FIG. 2 is an equivalent circuit diagram of the array structure of memory cells.
Figure 3:
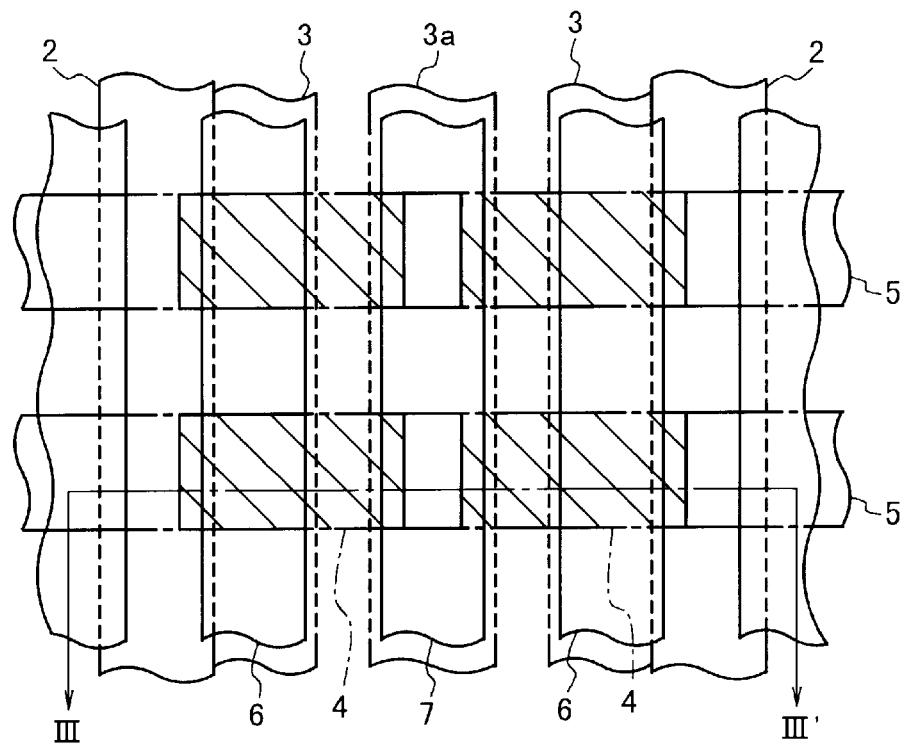
FIG. 3 is a plan view of a memory cell according to the first embodiment of the present invention.

FIG. 3 is a plan view of a memory cell section of a flash EEPROM, and

Figure 4:
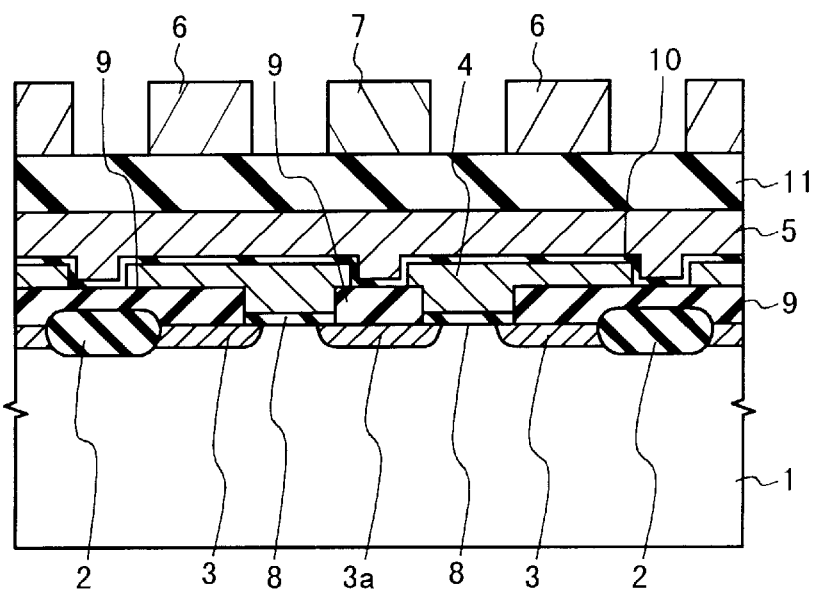
FIG. 4 is a cross sectional view of the memory cell according to the first embodiment of the present invention when it is cut along the line III–III'.

FIG. 4 is a cross sectional view of the memory cell section when the flash EEPROM is cut along the line VII–VII' shown in FIG. 3.

FIGS. 5A to 5G are cross sectional views of the manufacturing process of this memory cell in order.

As shown in FIG. 3, strip-shaped field oxide films 2 are formed and buried diffusion layers 3 for sub-bit lines are formed in parallel to the field oxide films 2. Also, a buried diffusion layer 3a for a sub-source line is formed with the similar pattern. Then, floating gate electrodes 4 which are shown by the slanted lines are formed in an island manner and word lines 5 are formed above these floating gate electrodes 4. Further, main bit lines 6 are formed above the buried diffusion layers 3 and a main source line 7 is provided above the buried diffusion layer 3a.

As shown in FIG. 4, in this section structure, field oxide films 2 are formed in predetermined areas on the surface of a silicon substrate 1. Then, buried diffusion layers 3 and 3a are formed, and then first gate insulating films 8 are formed. Subsequently, insulating films 9 are provided to cover the buried diffusion layers 3 and 3a in self-alignment manner. Further, floating gate electrodes 4 are formed to cover the first gate insulating film 8 and to cover the part of the insulating film 9 on the diffusion layer. A second gate insulating film 10 is formed on the surface of the floating gate electrode 4, and a word line 5 is formed on the second gate insulating film 10. Subsequently, an interlayer insulating film 11 is formed, and then main bit lines 6 and a main source line 7 formed of metal such as aluminum are provided on this interlayer insulating film 11. The main bit lines 6 and the main source line 7 are connected to the buried diffusion layers 3 and 3a in predetermined areas, respectively.

Next, a manufacturing method of the non-volatile semiconductor memory device according to this embodiment will be described.

Figure 5A:
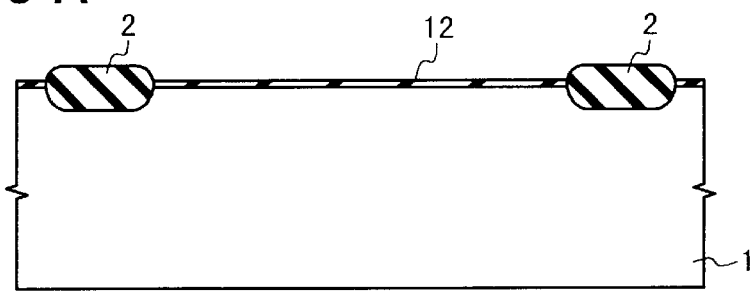
FIGS. 5A to 5G are cross sectional views of the manufacturing process of a memory cell in order according to the first embodiment of the present invention.

First, as shown in FIG. 5A, a protection insulating film 12 is formed on the surface of a silicon substrate 1 of a P-type conductive type. The protection insulating film 12 is a silicon oxide film which has the film thickness of 5 to 10 nm, and is formed by use of the chemical vapor deposition (CVD) method or the thermal oxidation method. Subsequently, field oxide films 2 are formed in predetermined areas. Generally, the field oxide films 2 can be formed by use of the LOCOS method or the trench element separation (trench) method.

Figure 5B:
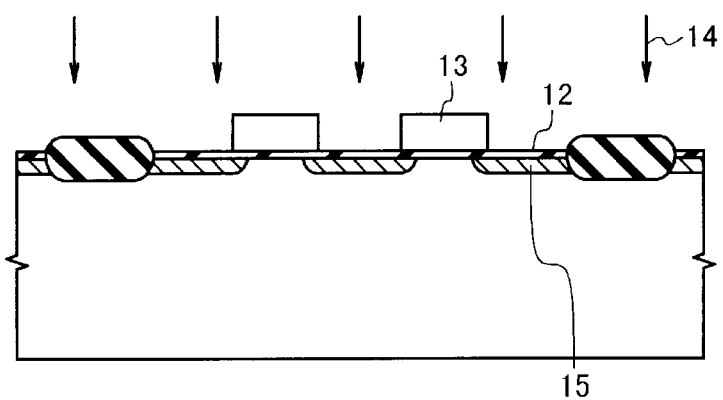

Next, as shown in FIG. 5B, photo-resist masks 13 are formed in predetermined areas by use of photolithography technique. The photo-resist masks 13 functions first insulating films.

Then, arsenic ions 14 are implanted by use of ion implantation. In this case, a dose quantity is set to about $1 \times 10^{15}/cm^2$. Also, implantation energy is set to 20 to 40 keV.

Impurity introduction layers 15 are formed by use of this ion implantation. At the same time, the nature of the surfaces of the photo-resist masks 13 is changed. That is, the hydrophobic property of the surfaces of the photo-resist masks 13 is increased very high.

Figure 5C:
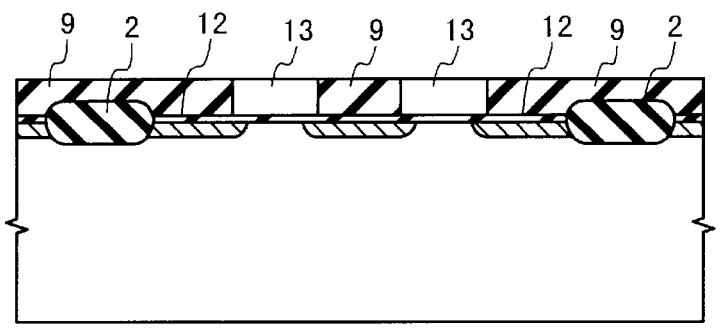

Next, as shown in FIG. 5C, insulating films 9 are formed on the diffusion layers in a surface area other than the area where the photo-resist masks 13 are formed. These insulating films 9 function second insulating films. These insulating films 9 are formed on the diffusion layers by use of the following selective liquid-phase growth method. That is, the silicon substrate in the state shown in FIG. 5B is dipped in the solution of silicon-dihydride-hexafluoride ($H_2SiF_6$) in which high purity silica and boron-trihydride-trioxide ($H_3BO_3$) are solved in an over-saturated state. For this reason, the following liquid-phase chemical reactions occur.

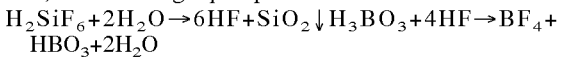

A silicon oxide film is selectively formed in liquid phase in accordance with the above reactions. That is, the silicon oxide films are formed only on the surface of the field oxide films 2 and on the surface of the protection insulating film 12.

As shown in FIG. 5C, in the manufacturing process of the present invention, the nature of the surface of the photo-resist masks 13 is changed through the ion implantation such that the hydrophobic property of the photo-resist masks 13 is increased very high on the surface. For this reason, the liquid-phase growth of the silicon oxide films is not achieved at all on the photo-resist masks 13. On the other hand, nucleus for the oxide film growth can be easily formed on the surface of the protection insulating films 12 because of the ion implantation. Therefore, the selective formation of the silicon oxide films is easily performed on the surface of the protection insulating films 12.

For example, the formation of a silicon oxide film by use of the liquid-phase chemical reaction is described in detail in the following papers: "A New Process for Silica Coating", (Journal of Electrochemical Society, Vol. 135, No. 8, 1988, pp. 2013 to 2016: Example 3) or "A New Interlayer Formation Technology for Completely Planarized Multilevel Interconnection by Using LPD" (1990 Symposium on VLSI Technology, pp. 3 to 4: Example 4).

Figure 5D:
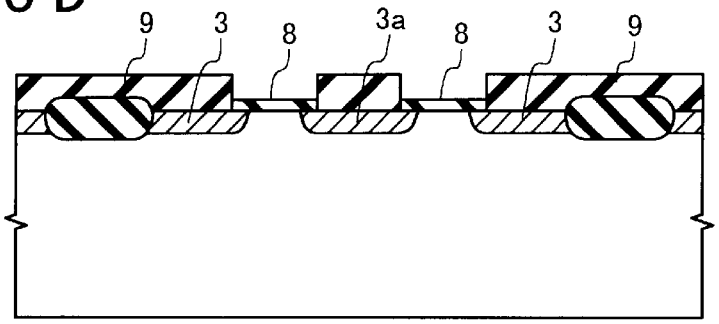

Next, as shown in FIG. 5D, the photo-resist masks 13 are peeled off. Subsequently, heat treatment is performed to bake the insulating films 9 on the diffusion layer. Also, at the same time, the impurity introduction layers 15 are activated and buried diffusion layers 3 and 3a are formed. Subsequently, the protection insulating films 12 under the photo-resist masks 13 are removed, and then, first gate insulating films 8 are newly formed by use of a thermal oxidation method. The first gate insulating films 8 are the silicon oxide films which have the film thickness of 7 to 10 nm.

Figure 5E:
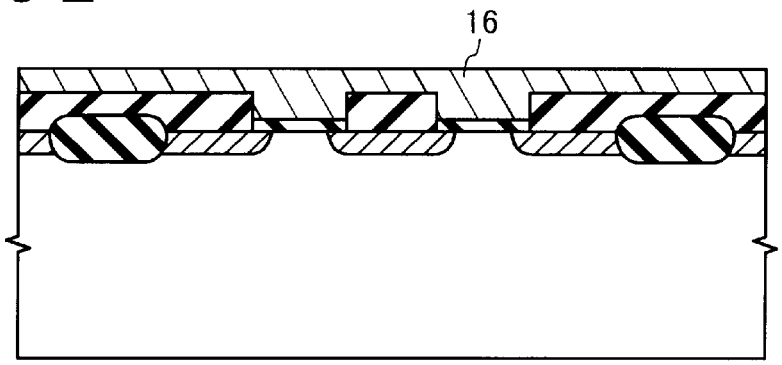

Next, as shown in FIG. 5E, a first polysilicon film 16 is deposited on the surface. Phosphorus impurity ions are contained in the first polysilicon film 16.

Figure 5F:
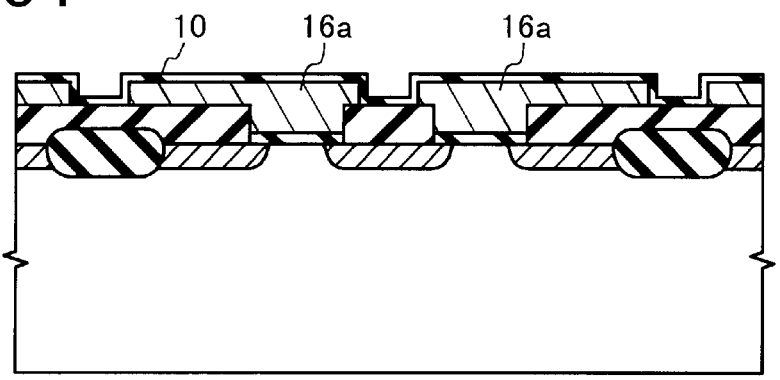

Next, as shown in FIG. 5F, first polysilicon films 16a are formed in a stripe manner. These stripe-shaped first polysilicon films 16a are formed by use of patterning the above first polysilicon film 16 to the direction of the bit line.

Subsequently, a second gate insulating film 10 is formed on the surface of the stripe-shaped first polysilicon films 16a. The second gate insulating film 10 is composed of the ONO film structure which was described in the conventional example.

Subsequently, a second polysilicon film is deposited by use of a CVD method to cover the second gate insulating film 10. Phosphorus impurity ions are contained in this second polysilicon film.

Figure 5G:
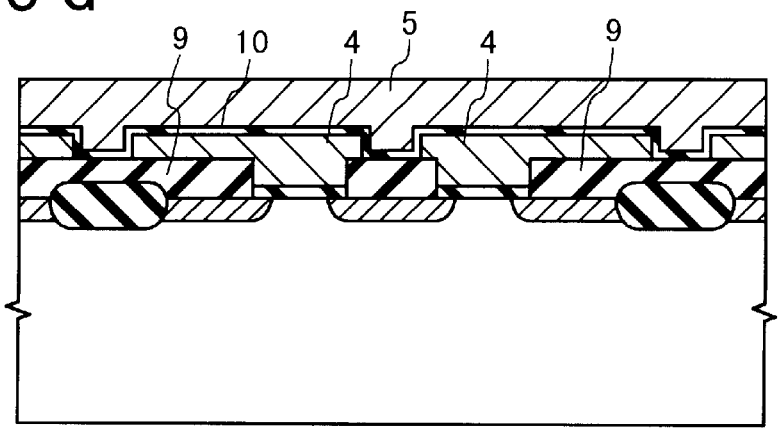

Next, as shown in FIG. 5G, the second polysilicon film is patterned by use of photolithography technique and dry etching technique to form a word line 5. Further, the stripe-shaped first polysilicon films 16a are patterned in the direction of the word lines in self-alignment manner with the word lines to form floating gate electrodes 4, respectively. In this case, the insulating films 9 on the diffusion layer function as an etching stopper for the silicon substrate not to be etched, in the area where the first polysilicon films are already removed.

As shown in FIG. 3, an interlayer insulating film 11 is formed, and then a wiring layer for main bit lines 6 and a main source line 7 is formed in the subsequent steps. Thus, the contactless memory cell is completed.

Figure 6:
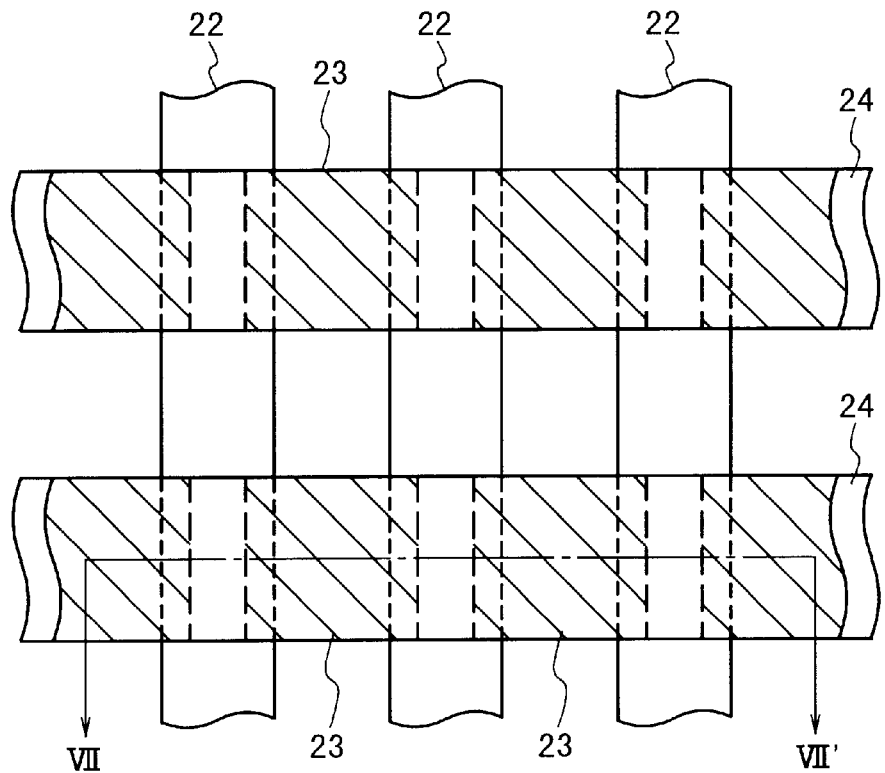
FIG. 6 is a plan view of a memory cell according to the second embodiment of the present invention.
Figure 7:
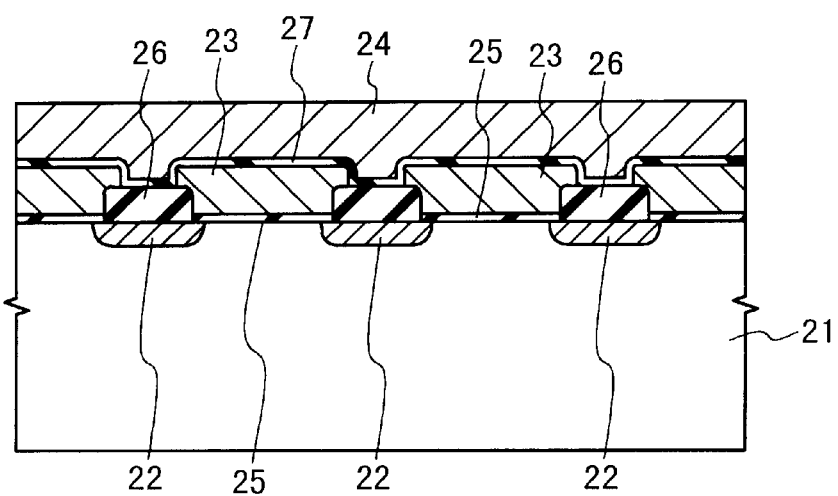
FIG. 7 is a cross sectional view of a memory cell according to the second embodiment of the present invention when it is cut along the line VII–VII'.

Next, a manufacturing method of a semiconductor device according to the second embodiment of the present invention will be described with reference to FIGS. 6 and 7, and FIGS. 8A to 8H. FIG. 6 is a plan of a memory cell in a NAND-type or VGA-type of flash EEPROM. FIG. 7 is a cross sectional view of the memory cell cut along the line VII–VII' shown in FIG. 6. FIGS. 8A to 8H are cross sectional views of a manufacturing process of this memory cell in order.

As shown In FIG. 6, buried diffusion layers 22 are provided in a stripe manner on a silicon substrate surface. Then, floating gate electrodes 23 shown by the slanted lines are formed. Word lines 24 are provided on the floating gate electrodes 23.

As shown in FIG. 7, In the section structure, buried diffusion layers 22 are formed in predetermined areas on the surface of the silicon substrate 21 and first gate insulating films 25 are formed. Then, insulating films 26 on the diffusion layers are provided in self-alignment manner with the diffusion layers to cover the buried diffusion layers 22, respectively. Further, floating gate electrodes 23 are formed to cover the first gate insulating films 25 and a part of the insulating films 26 on the diffusion layers. A second gate Insulating film 27 is formed on the surface of the floating gate electrodes 23, and a word line 24 is formed on the second gate insulating film 27. After this, although not illustrated, an interlayer insulating film is formed, and then main bit lines formed of metal such as aluminum are formed on the interlayer insulating film. The main bit lines are connected to the buried diffusion layers 22 in predetermined areas, respectively.

Next, a manufacturing method of a memory cell of the non-volatile semiconductor memory device according to this second embodiment will be described.

Figure 8A:
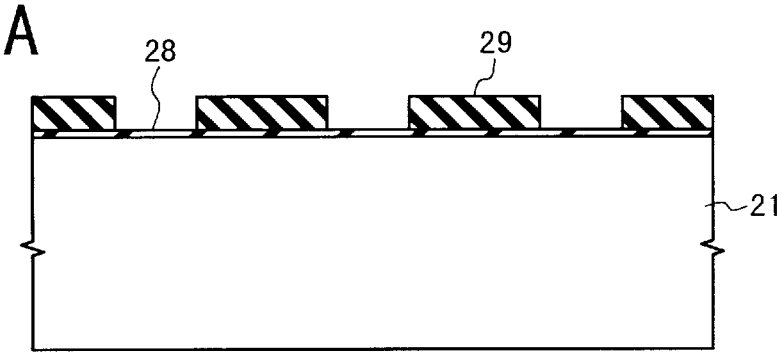
FIGS. 8A to 8H are cross sectional views of a manufacturing process of a memory cell in order according to the second embodiment of the present invention.

First, as shown in FIG. 8A, a protection insulating film 28 is formed on the surface of a silicon substrate 21 of a P-type conductive type. The protection insulating film 28 is formed by use of the CVD method or the thermal oxidation method to have the film thickness of 10 to 20 nm. Subsequently, insulating film masks 29 are formed in predetermined areas. The insulating film masks 29 are the silicon nitride films which have the film thickness of 200 to 400 nm.

Figure 8B:
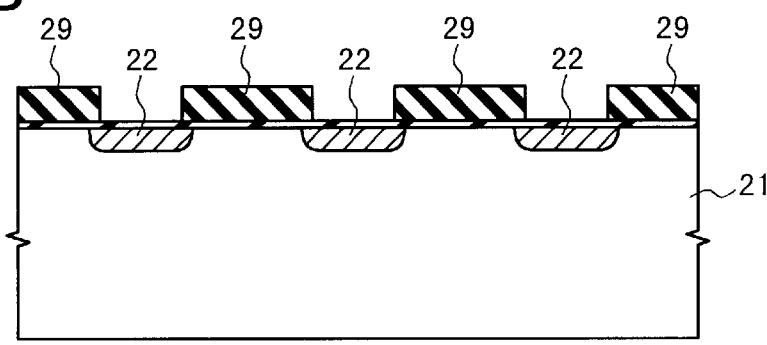

Next, as shown in FIG. 8B, using the insulating film masks 29 as an ion implantation mask, arsenic ions are implanted by use of ion implantation. Then, heat treatment is performed. Thus, buried diffusion layers 22 are activated. In this case, a dose quantity of the ion implantation is set to be about $1 \times 10^{15}/cm^2$. Also, the implantation energy is set to be as much as 50 keV.

Figure 8C:
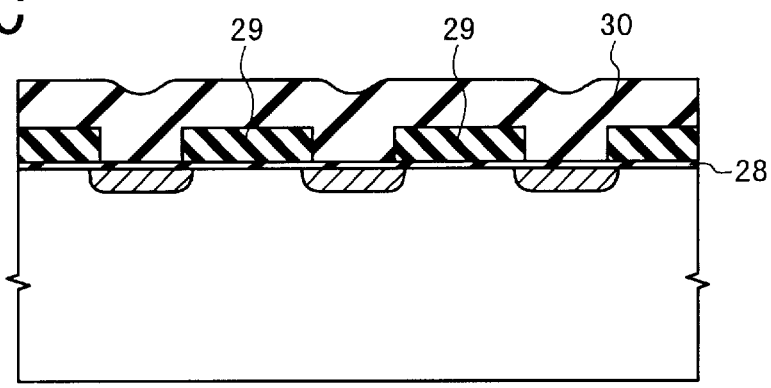

Next, as shown in FIG. 8C, a coverage insulating film 30 is formed on the insulating film masks 29 and the protection insulating film 28. In this case, the coverage insulating film 30 is the silicon oxide film which has the film thickness of 200 to 500 nm.

Figure 8D:
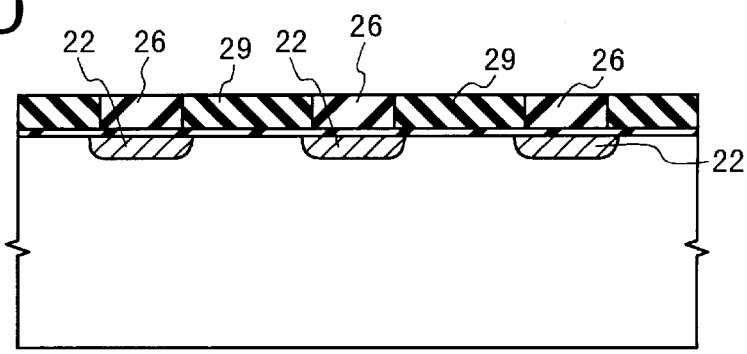
Figure 8E:
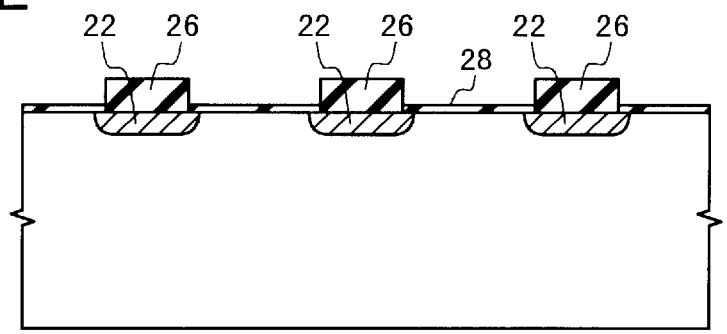

Next, as shown in FIG. 8D, the coverage insulating film 30 is polished by use of a chemical mechanical polishing (CMP) method to form insulating films 26 on the diffusion layer. In this case, the insulating film masks 29 function as a process stopper in this CMP method. Subsequently, the insulating film masks 29 are selectively etched and removed. This etching removal is performed by use of a wet etching process in phosphoric acid solution of about 140° C. Thus, as shown in FIG. 8E, the insulating films 26 on the diffusion layer are formed on the buried diffusion layers 22 in a self-alignment manner with the buried diffusion layers 22.

Figure 8F:
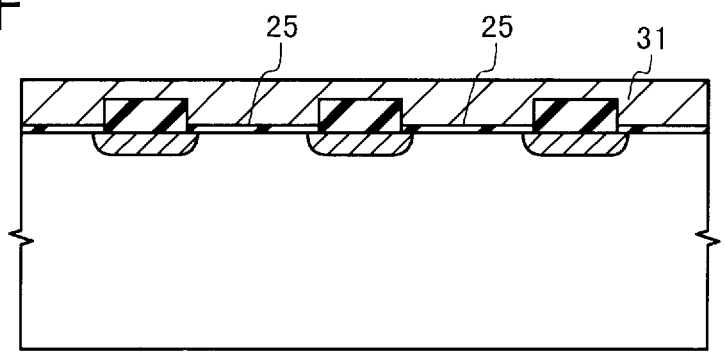

Then, as shown in FIG. 8F, the protection insulating film 28 is removed by use of an etching process, and then first gate insulating films 25 are newly formed by use of a thermal oxidation method. The first gate insulating films 25 are the silicon oxide films which have the film thickness of 7 to 10 nm. Subsequently, a first polysilicon film 31 is deposited over the surface. Phosphorus impurity ions are contained in the first polysilicon film 31.

Figure 8G:
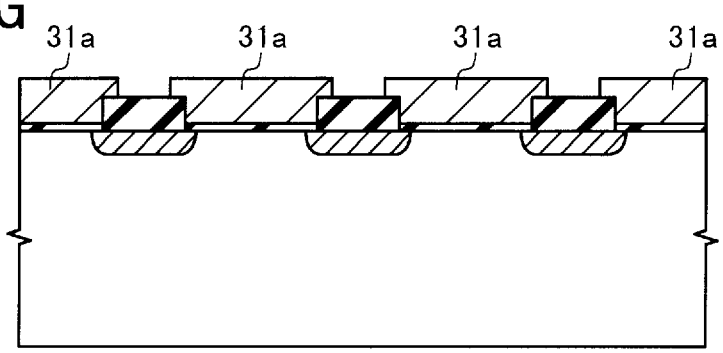

Next, as shown in FIG. 8G, first polysilicon films 31a are formed in a stripe manner. These stripe-shaped first polysilicon films 31a are formed by use of patterning the above first polysilicon film 31 in the direction of a bit line.

Figure 8H:
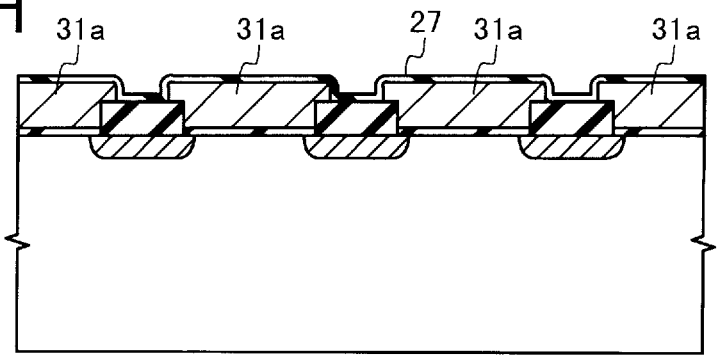

Next, as shown in FIG. 8H, a second gate insulating film 27 which is composed of an ONO film is formed on the surface of the stripe-shaped first polysilicon films 31a.

Next, although not illustrated, a second polysilicon film is deposited by use of a CVD method to cover the second gate insulating film 27. Phosphorus impurity ions are contained in the second polysilicon film.

Next, this second polysilicon film is patterned by use of photolithography technique and dry etching technique to form the word lines 24 which have been described with reference to FIGS. 6 and 7. In this case, the stripe-shaped first polysilicon films 31a are patterned in a self-alignment manner in the direction of the word line to form the floating gate electrodes 23 which have been described with reference to FIG. 6 and 7. In this case, as having been described according to the first embodiment, the insulating films 26 on the diffusion layers functions as the etching stopper for the silicon substrate not to be etched.

As described above, according to a contactless memory cell of the non-volatile semiconductor memory device of the present invention, the insulating film on the diffusion layer is formed in a self-alignment manner on the buried diffusion layers which constitutes a bit line or a source line without using a thermal oxidation method. Therefore, there is generated no bird's beak, i.e., the extension of the silicon oxide film in a channel direction of the floating gate-type transistor, which is generated by the thermal oxidation in the conventional example. For this reason, the floating gate-type transistor can be manufactured to have small deviations of the gate length and to be suitable for fine processing.

Also, in the present invention, because a buried diffusion layer is not subjected to thermal oxidation, re-distribution of the impurity ions in the buried diffusion layer hardly occurs. Therefore, the estimation of the electric characteristic such as the electric resistance of the buried diffusion layer or the junction breakdown voltage with the silicon substrate becomes easy. As a result, the design of the buried diffusion layer of the contactless memory cell becomes very simple.

In this manner, it can be made easy to manufacture a memory cell with very fine processing, so that the high integration of the non-volatile semiconductor memory device can be more promoted.

What is claimed is:

1. A method of manufacturing a semiconductor device, comprising the steps of:

forming a field oxide film on said semiconductor substrate;

forming a mask film on said semiconductor substrate which is uncovered by said field oxide film;

forming diffusion layers on said semiconductor substrate using said mask film and said field oxide film as a mask, said diffusion layers having a conductive type different from that of said semiconductor substrate;

forming insulating films on said diffusion layers;

removing said mask film;

forming a polysilicon floating gate between said insulating films on said semiconductor substrate via a first gate insulating film;

forming a second gate insulating film on said polysilicon floating gate and said insulating films; and forming a word line to cover said polysilicon floating gate via said second gate insulating film.

2. A method according to claim 1, wherein said mask film comprises a resist mask.

3. A method according to claim 1, wherein said step of forming insulating films includes making a surface of said mask film hydrophobic prior to the selective liquid phase growth method.

4. A method according to claim 3, wherein said step of forming diffusion layers includes performing ion implantation, and wherein said step of making a surface of said mask hydrophobic is said step of performing ion implantation.

5. A method according to claim 1, wherein said mask comprises an insulating film mask.

6. A method according to claim 5, wherein said mask is formed of silicon nitride, and said insulating films are formed of silicon oxide.

7. A method according to claim 1, wherein said step of forming a field oxide film includes forming said field oxide film on said semiconductor substrate in a stripe manner in a first direction, and wherein said step of forming diffusion layers includes forming said diffusion layers on said semiconductor substrate using said mask along said field oxide film in a stripe manner in the first direction, and wherein said step of forming a polysilicon floating gate between said insulating includes:

depositing a polysilicon layer; and patterning said polysilicon layer to cover a channel region between said diffusion layers via said first gate insulating film, and wherein said step of forming a word line includes forming said word line in a stripe manner in a second direction orthogonal to said first direction.

8. A method according to claim 7, further comprising the steps of:

forming a first conductive pattern in a stripe manner above one of said diffusion layers which is connected to said first conductive pattern; and forming a second conductive pattern in a stripe manner above the other of said diffusion layers which is connected to said second conductive pattern.

9. A method according to claim 1, wherein said step of forming insulating films includes forming said insulating films by a selective liquid phase growth method.

10. A method according to claim 9, wherein said step of forming insulating films includes:

depositing an insulating layer; and performing a chemical mechanical polishing method to the insulating layer using said mask as a stopper to form said insulating films.

11. A method according to claim 1, wherein said first insulating film comprises a silicon nitride film.

12. A method according to claim 1, wherein said step of forming second insulating film includes:

depositing an insulating layer; and performing a chemical mechanical polishing method to the insulating layer using said first insulating film as a stopper to form said second insulating films.

13. A method according to claim 1, wherein said step of forming a field oxide film includes forming said field oxide film on said semiconductor substrate in a stripe manner in a first direction, and wherein said step of forming diffusion layers includes forming said diffusion layers on said semiconductor substrate using said mask along said field oxide film in a stripe manner in the first direction, and wherein said step of forming a polysilicon floating gate between said insulating films includes:

depositing a polysilicon layer; and patterning said polysilicon layer to cover a channel region between said diffusion layers via said first gate insulating film, and wherein said step of forming a word line includes forming said word line in a stripe manner in a second direction orthogonal to said first direction.

14. A method according to claim 13, further comprising the steps of:

forming a first conductive pattern in a stripe manner above one of said diffusion layers which is connected to said first conductive pattern; and forming a second conductive pattern in a stripe manner above the other of said diffusion layers which is connected to said second conductive pattern.

15. A method according to claim 1, wherein said insulating films are formed on said diffusion layers by a CVD or thermal oxidation method.

* * * * *

UNITED STATES PATENT AND TRADEMARK OFFICE
CERTIFICATE OF CORRECTION

PATENT NO.     : 6,040,234                                            Page 1 of 1
DATED          : March 21, 2000
INVENTOR(S)    : Yosiaki Hisamune It is certified that error appears in the above-identified patent and that said Letters Patent is hereby corrected as shown below:

Column 9,
Line 46, insert -- films -- after "insulating".

Signed and Sealed this

Sixteenth Day of July, 2002

*Attest:*

*Attesting Officer*

JAMES E. ROGAN
*Director of the United States Patent and Trademark Office*